United States Patent [19]

Chitre

[11] 4,314,128

[45] Feb. 2, 1982

[54] SILICON GROWTH TECHNIQUE AND APPARATUS USING CONTROLLED MICROWAVE HEATING

[75] Inventor: Sanjeev R. Chitre, Reseda, Calif.

[73] Assignee: Photowatt International, Inc., Tempe, Ariz.

[21] Appl. No.: 115,952

[22] Filed: Jan. 28, 1980

[51] Int. Cl.³ .................. H05B 6/80; H05B 6/72; C30B 15/20

[52] U.S. Cl. ............... 219/10.55 B; 219/10.55 F; 219/10.55 M; 156/617 SP; 156/DIG. 73; 422/249

[58] Field of Search ............ 219/10.55 R, 10.55 M, 219/10.55 A, 10.55 B, 10.55 F, 10.49 R, 10.43, 10.47; 156/617 SP, DIG. 73, DIG. 102; 422/249

[56] References Cited

U.S. PATENT DOCUMENTS

| | | | |
|---|---|---|---|
| 2,852,420 | 9/1958 | Pohl | 156/617 SP |
| 3,342,559 | 9/1967 | Dermatis | 156/617 SP |
| 3,851,131 | 11/1974 | Johnston et al. | 219/10.55 A |
| 3,857,679 | 12/1974 | Allred | 422/249 |
| 3,974,355 | 8/1976 | Bach | 219/10.55 A X |
| 4,140,570 | 2/1979 | Voltmer et al. | 156/617 SP |
| 4,185,076 | 1/1980 | Hatch et al. | 219/617 SP X |
| 4,187,405 | 2/1980 | Püschner et al. | 219/10.55 A |
| 4,196,332 | 4/1980 | Mackay et al. | 219/10.55 R X |

*Primary Examiner*—B. A. Reynolds
*Assistant Examiner*—Philip H. Leung
*Attorney, Agent, or Firm*—Spensley, Horn, Jubas & Lubitz

[57] ABSTRACT

Control of thermal gradients in a crystal being pulled from a melt is achieved using stratified microwave coupling. Plural microwave radiators are arranged along the crystal path. The radiators are driven by power sources having stepped energy levels so that the radiated microwave energy heats successive regions of the crystal to progressively decreasing temperature levels. Each power source is swept in frequency, thereby controlling the depth of heating so as to achieve at each region a selected lateral temperature distribution (e.g., constant temperature across the crystal). Advantageously, the shape of each cavity conforms to the cross-sectional geometry of the crystal being pulled, which may be non-circular. This facilitates the growth of crystals having rectangular, trapezoidal or other shape. In such embodiment, the frequency sweep range, and possibly power, is separately controlled at different locations about the crystal so as to achieve the desired lateral temperature distribution.

15 Claims, 4 Drawing Figures

SILICON GROWTH TECHNIQUE AND APPARATUS USING CONTROLLED MICROWAVE HEATING

BACKGROUND OF THE INVENTION

1. Field of the Invention

The present invention relates to a technique and apparatus for growing single crystal materials such as silicon using controlled microwave heating to establish a step-wise reduced temperature gradient for the silicon being pulled from the melt, while maintaining minimal lateral temperature gradient at each step. This control of the thermal gradients during crystal pulling increases the speed at which silicon can be grown, and enables the growth of silicon in rods having rectangular and other cross-sectional geometries not possible in the prior art.

2. Description of the Prior Art

A substantial percentage of all device grade, single crystal silicon and other semiconductor material presently is grown using the Czochralski method. Silicon is heated to the molten state in a crucible. A single crystal seed is dipped into the melt. As silicon starts to grow on the seed, the crystal is slowly withdrawn from the melt. An appropriate mechanism thereafter pulls the crystal at a rate commensurate with single crystal growth.

As described in the text entitled "Silicon Semiconductor Technology" by W. P. Runyan, McGraw-Hill Book Company, 1965, in Chapter 4, entitled "Crystal Growth", there are two possible rate limiting steps in growth from the melt. One is the time required for atoms within the liquid to diffuse to an appropriate crystal site. This time is usually very short, and in most systems is not the mechanism which limits growth rate. The second rate limiter, and the one normally of most importance, is the requirement that the latent heat of fusion be removed from the crystal-melt system. There are in principle two ways in which this heat may be removed: (a) it may be removed through the body of the crystal itself, or (b) the liquid near the liquid-solid interface may be super-cooled by a heat sink other than the crystal. Because of the high probability of spurious nucleation at the highly super-cooled liquid-container boundary, the latter technique is seldom used.

In most prior art silicon growth techniques, the latent heat of fusion is removed by thermal radiation from the crystal being grown. Heat removal may be aided by providing a heat transfer medium external to the rod. Normally this results in a rod shape with a circular cross-section. Uniform radiation occurs around the entire crystal periphery. At any particular distance from the melt, the rod exhibits a significant lateral thermal gradient in which the temperature is a maximum at the axis and decreases linearly with increasing radius.

There are several consequences of this cooling by thermal radiation from the surface. Although uniform single crystal growth is accomplished, the geometry is limited to a rod shape of circular cross-section. Moreover, the growth rate (i.e., the rate at which the crystal can be pulled while still ensuring single crystal formation) is inversely proportional to the crystal diameter. An increase in growth rate necessitates a reduction in the crystal rod diameter.

One object of the present invention is to provide a silicon growth apparatus and technique which facilitates increase growth rate without a reduction in the rod diameter. Another objective is to provide an apparatus and method for growing single crystal silicon and other material in rods having cross-sectional shapes that are non-circular, including rectangular geometries.

With regard to shape, for some applications, the circular semiconductor shape is economically disadvantageous. An example is the production of solar cells. If formed on circular wafers and mounted next to one another on a planar surface, significant gaps exist between adjacent solar cells. The packing density, and hence the electrical output per square unit of surface, could be substantially improved by using square or rectangular shaped solar cells. However, if such solar cells are cut from circular wafers, a great deal of semiconductor material is wasted. Thus for optimum cost effectiveness, it would be ideal to have the solar cells fabricated from ingots of single crystal silicon which is grown with a square or rectangular cross-section. The present invention facilitates such growth.

Certain techniques have been proposed in the past to control the cooling of the single crystal rod being pulled from the melt. Some of these are reviewed in the book entitled "Semiconductor Crystal Manufacture" by Marshall Sittig, 1969, Noyes Development Corporation. In the U.S. Pat. No. 3,226,203 to Rummel, the longitudinally growing crystal is pulled through a cooling chamber. There coolant oil is circulated to aid thermal transfer away from the crystal. In the U.S. Pat. No. 3,251,665 to Bennett, a thermal gradient control member formed of electrical conducting material and disposed on top of the melt crucible is used to control the thermal gradient at the top of the molten pool in the crucible. In the U.S. Pat. No. 3,173,765 to Gobat et al, the crystal is pulled through a series of chambers having controlled atmospheres. None of these techniques eliminate the lateral thermal gradient in the crystal rod being pulled, and all depend on uniform radiation from the rod surface to cool the crystal.

By contradistinction, an object of the present invention is to provide a technique in which the single crystal material being pulled is actually heated in a controlled manner so as to minimize the lateral thermal gradient at each distance from the melt. A step-wise reduction in temperature is achieved within increasing distance. As a result, removal of the latent heat of fusion no longer depends only on the uniform radiation from the surface of the circular rod. Arbitrary selection of geometry is permissible, and growth rates substantially faster than those of the prior art are facilitated.

SUMMARY OF THE INVENTION

These and other objectives are achieved by providing a silicon growth technique in which microwave energy is used to control the thermal gradients and cooling characteristics of single crystal material being pulled from a melt.

In a preferred embodiment, the emerging crystal is pulled through a series of microwave sources which surround the crystal. These sources are used respectively to heat the crystal to progressively lower temperatures. At each source the frequency is appropriately swept so that the microwave energy coupled into the crystal heats the rod to a greater degree near the exterior surface, and to a lesser degree near the central axis. The microwave heating thus complements the normal radiative heat loss, which is a maximum near the surface and a minimum near the center, thereby resulting in minimal thermal gradient across the rod. In other words, adjacent to each microwave source the lateral temperature distribution across the crystal is substantially uniform.

The power level of successive microwave sources is decreased in step-wise fashion with increasing distance from the melt. As a result, the temperature of the emerging single crystal rod is reduced in corresponding steps. Controlled cooling is achieved, at a rate that does not depend solely on thermal radiation from the crystal surface or on external heat transfer mechanism to remove the heat. Thus a significant growth rate limiting factor of the prior art is eliminated.

Rectangular and other crystal geometries can be achieved using the present invention by appropriate control of the frequency scanning of the microwave sources at each step. For example, to produce a crystal having a square cross-section, at each step the microwave source may consist of an array of microwave radiators themselves arranged in a square. The microwave sources near the corners of the square array are controlled so as to sweep down to a lower frequency than the radiators near the center of each side of the array. Since the depth of microwave penetration is inversely proportional to frequency, this frequency sweeping arrangement will result in the desired heating of the emergent crystal to a uniform temperature.

BRIEF DESCRIPTION OF THE DRAWING

A detailed description of the invention will be made with reference to the accompanying drawings wherein like numerals designate corresponding elements in the several figures which are not necessarily to scale.

DESCRIPTION OF THE PREFERRED EMBODIMENTS

The following detailed description is of the best presently contemplated modes of carrying out the invention. This description is not to be taken in a limiting sense, but is made merely for the purpose of illustrating the general principles of the invention, since the scope of the invention best is defined by the appended claims.

Operational characteristics attributed to forms of the invention first described shall be attributed to forms later described, unless such characteristics obviously are inapplicable or unless specific exception is made.

Figure 1:
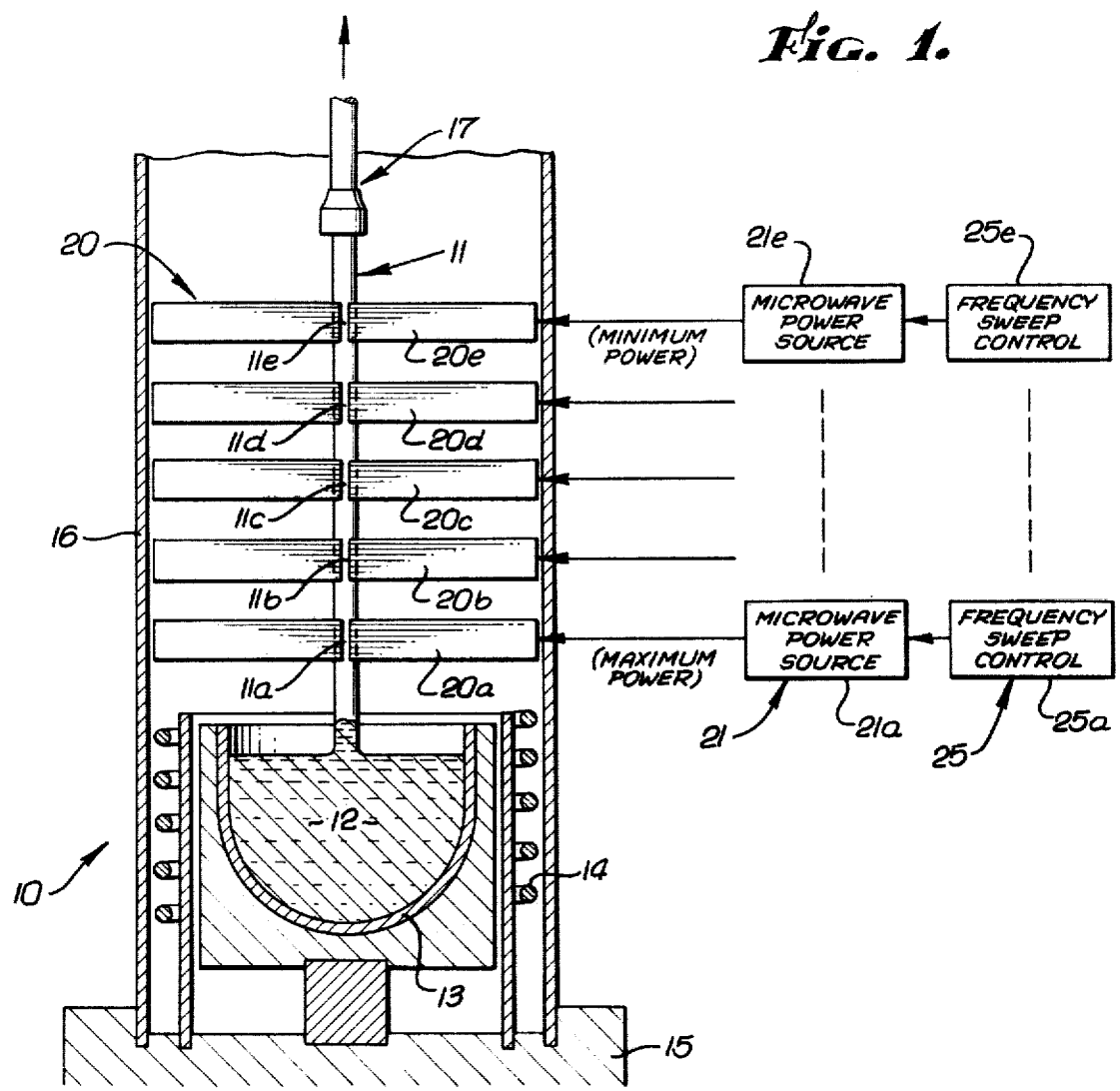
FIG. 1 is a pictorial, partly diagrammatic view of a silicon growth apparatus using microwave heating in accordance with the present invention.

Referring to FIG. 1, the inventive apparatus 10 is used to facilitate the growth of a rod 11 of a single crystal material such as silicon. In a manner known per se, a melt 12 of molten silicon is provided in a crucible 13 that is heated by conventional means such as an RF inductive heating coil 14. The crucible 13 and coil 14 are appropriately mounted on a support 15 on which there is also affixed a housing 16. The rod 11 advantageously is started from a seed that is dipped into the melt 12 and initially pulled in accordance with conventional Czochralski procedures. The rod 11 thus is attached to a puller 17 which is driven upward by a mechanism (not shown) that is conventional except that the pulling rate may be faster than when employing prior art crystal cooling methods.

Unique to the present invention is a set 20 of microwave power radiators each driven by a corresponding microwave power source 21. The power level of each source 21 is adjusted so that maximum power is provided to the microwave radiator 20a which is nearest the melt 12, and minimum power is provided to the radiator 20e which is furthest from the melt 12. The intermediate radiators 20b-20d are supplied with power levels at progressively decreasing steps between the maximum and minimum power levels. As a result, the rod 11 is subjected to microwave heating which decreases in steps from the maximum heating in the region 11a that is exposed to the radiator 20a to the minimum heating in the region 11e that is exposed to the radiator 20e. A controlled step-wise decrease in temperature thus is provided to the rod 11 by this stratified microwave coupling arrangement.

The actual heating imparted to the rod 11 at each of the regions 11a through 11e is not a constant, but rather will vary with depth into the rod 11, even when constant power is suppied from the associated microwave source. This may be understood in conjunction with the graph of FIG. 3. There, the curve 23 depicts a typical lateral temperature gradient within the rod 11 at a fixed height above the melt 12, in the absence of any microwave heating. The temperature is a maximum at the center or axis $11'$, and decreases generally linearly within increasing radius, to a minimum temperature adjacent the outside surface $11''$ of the rod.

As a consequence of the temperature gradient within the rod 11, the dielectric constant of the rod also varies as a function of radius. As indicated by the broken curve 24 in FIG. 3, the dielectric constant varies generally inversely with temperature, and thus is a minimum at the center $11'$ of the rod, and is a maximum adjacent the external surface $11''$. For silicon in the solidified state at room temperature, the dielectric constant is about 4.0. Over the temperature range between the typical melt 12 temperature of 2000 C. and the room temperature of the solidified rod 11 at the puller 17, the silicon will vary in dielectric constant between about 1.5 and 4.0. Thus the specific values of the dielectric constant at a particular region 11a-11e will depend on the distance of that region from the melt 12. For example, in the region 11a, the dielectric constant (as represented by the broken curve 24 in FIG. 3) may vary from a value of say 1.7 at the axis $11'$ to a value of say 1.9 at the surface $11''$ of the rod. A similar curve in the region 11e may indicate a dielectric constant which varies from a minimum of say 3.7 at the axis $11'$ to a maximum of 3.9 at the surface $11''$.

Figure 3:
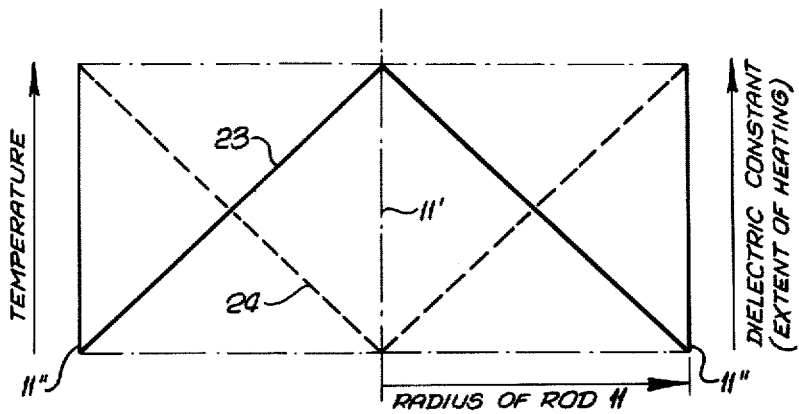
FIG. 3 is a graph showing the lateral thermal gradient resulting from surface radiation from a circular rod being pulled from a melt, and also showing the complementary heating induced by the microwave sources employed in the apparatus of FIGS. 1 and 2.

For a fixed value of microwave power supplied by a particular source 21, the amount of heating of the corresponding rod 11 region will depend on the dielectric constant thereof. In general, the higher the dielectric constant, the higher will be the dielectric losses within the rod and hence the higher will be the amount of heating imparted to that region by a microwave source of fixed power level. Since, as indicated by FIG. 3, the dielectric constant at each region 11a-11e generally varies inversely with increasing depth, a fixed level of microwave power will result in maximum heating of the rod portions nearest the surface, and minimum heating of the rod adjacent its central axis. That is, the extent of heating induced by a constant power source as a function of the radius of the rod 11 will approximately correspond to the curve 24 of FIG. 3. Note that this heating inherently complements the temperature gradient within the same region of the rod 11. That is, maximum heating is achieved near the surface where the initial temperature of the rod is lowest, while the microwave heating is a minimum along the rod axis, where the initial temperature was greatest. The net result is to establish a substantially uniform or constant temperature within each region 11a–11e. In other words, the net lateral temperature gradient at each rod 11 region approaches zero.

To achieve the heating effect just described, each microwave power source 21 advantageously is swept in frequency by a corresponding control circuit 25. In general, the depth of penetration of microwave energy into the rod 11 is inversely porportional to the frequency. In other words, at a relatively high frequency the energy will penetrate only slightly below the surface 11''. As the frequency is decreased, the microwave energy will penetrate deeper into the rod. Thus, each of the frequency sweep control circuits 25a–25e functions to control the frequency range of the corresponding microwave power source 21a–25e so as to achieve a range of penetration depths covering the entire thickness of the rod 11, with substantially uniform power transmission to each depth.

By way of example, the microwave power source 21a may be adjusted to provide a power level of say 100 watts, and to be swept over a frequency range of say 100 GHz down to 100 MHz under control of the circuit 25a. In the manner described above, this will heat the region 11a to a substantially uniform temperature, the actual value of which will depend on the material of the rod 11, the maximum power level, the frequency sweep range, the efficiency of the microwave radiator 20a, and the distance between the radiator 20a and the top of the melt 12.

Similarly, the microwave power source 21e may be adjusted to provide a minimum power level of say 10 watts and to be swept over the same frequency range of 100 GHz to 100 MHz. The resultant heating will cause the region 11e to have a substantially uniform temperature independent of radius, that is, to have a lateral temperature gradient which approaches zero. Intermediate these extremes the microwave power sources 21 supplying the radiators 20b through 20d advantageously have power levels in decreasing the intermediate steps between the maximum power level of 100 watts and the minimum power level of 10 watts. The sweep range of each such power source again may be from 100 GHz to 100 MHz. As a result, each of the regions 11a through 11e will have a substantially uniform temperature, and these temperatures will step-wise decrease from a maximum at the region 11a to a minimum at the region 11e.

Although in the foregoing description each microwave power source 21 was stated to provide a fixed power output level independent of frequency, the invention is not so limited. It may be desirable, or necessary with certain rod geometries, also to vary the power level from each source 21 as the frequency is swept, so as to achieve the requisite heating necessary to produce a uniform radial temperature distribution over the entire region of the rod 11 that is heated by such source.

Moreover, although in the foregoing description each of the frequency sweep control circuits 25 was indicated to have the same sweep range, the invention is not so limited. Each control circuit 25 may impart a different sweep frequency range to the corresponding power source 21, or may sweep the corresponding source over the same frequency range but not in unison with the frequency sweeping of the other power sources 21. In general, a combination of frequency sweep range, sweep rate, and power output level will be utilized to achieve the desired substantially constant temperature characteristic of the region of the rod that is being heated. Moreover, the temperature increments or steps between successive regions 11a through 113 advantageously will be selected to correspond to a desired rate of cooling of the rod 11, commensurate with a particular pull rate. Instead of separate microwave power sources 21a–21e, a single power source may be used and connected to each of the radiators 20a–20e via a set of attenuators configured to provide step-wise decreasing power to each such radiator. Fewer or more radiators 20 can be employed.

Figure 2:
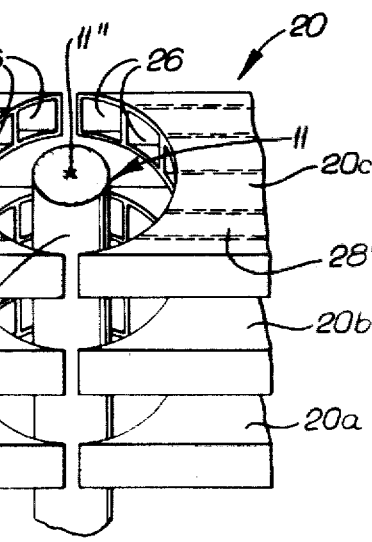
FIG. 2 is a fragmentary pictorial view of the apparatus of FIG. 1 showing certain details of the microwave radiation sources at each cooling step.

The design of each microwave radiator 20 is not critical. FIG. 2 shows one possible arrangement that is useful when producing a rod 11 of circular cross-section. Here the typical radiator 20c consists of two waveguides 28, 28' each of which terminates in a semicircular open end facing the rod 11. Each waveguide 28, 28' is divided into a set of channels 26 each having an associated microwave radiator, known per se, that is driven by the power source 21c. All of the radiators associated with the waveguide channels 26 may be driven in unison. Alternatively, they may be driven sequentially from a single microwave power source 21c using an appropriate time division scanner 27. Advantageously, the radiation from each of the waveguide channels 26 should be in phase with the radiation that is concurrently being produced in others of the channels 26.

The arrangement of microwave radiators shown in FIG. 2 is exemplary only. There may be more or fewer waveguide channels 26. Each channel may be oriented radially or at some other angle with respect to the rod 11. For a circular geometry, the general requirement is just that a circularly symmetric microwave energy source be provided to the rod 11.

Figure 4:
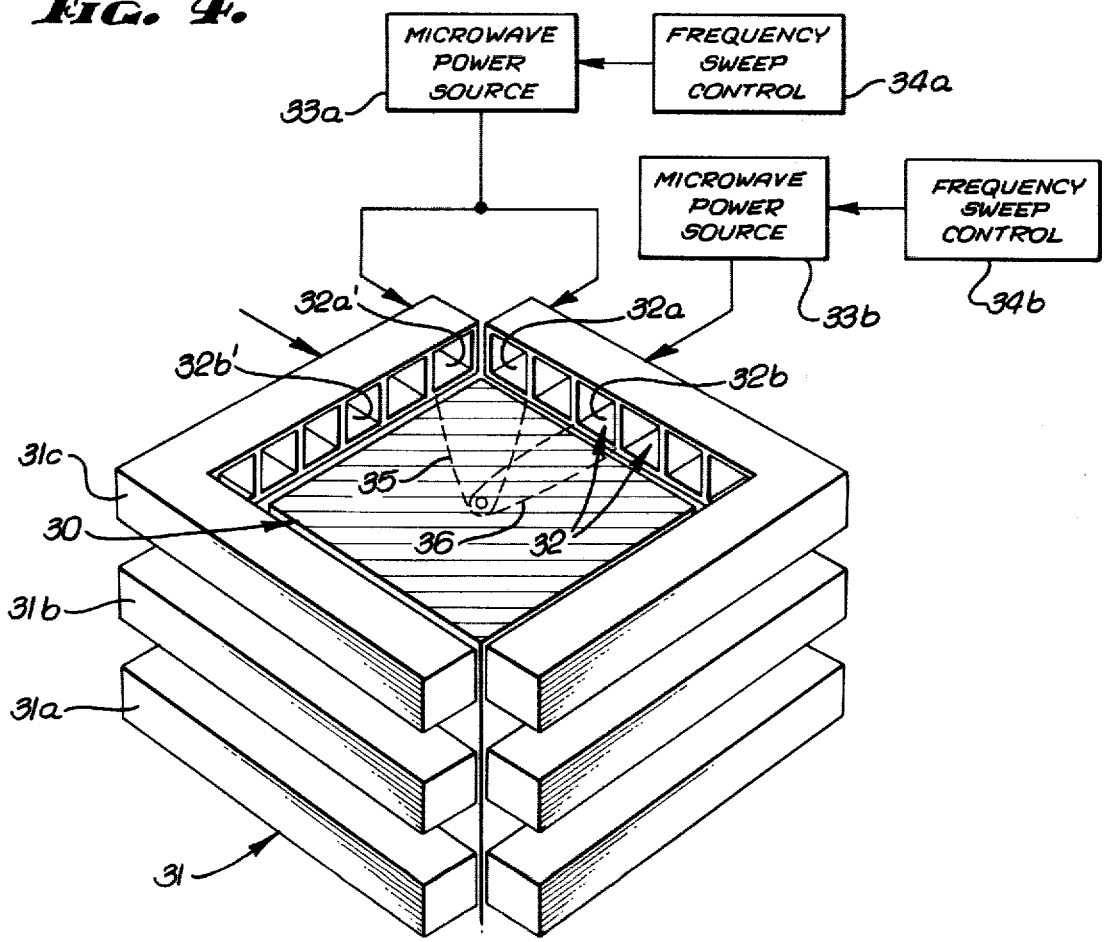
FIG. 4 is a fragmentary pictorial view, from generally the same aspect as FIG. 2, showing an alternative embodiment of the invention for the production of single crystal rods having square cross-section.

By modifying the shape of the microwave cavities that are used as the radiators 20, an appropriately controlling the power and frequency sweeping of the microwave power sources 21, single crystal rods of arbitrary cross-sectional geometry can be produced in accordance with the present invention. For example, FIG. 4 illustrates an embodiment of the invention useful for producing a rod 30 of single crystal material having a square cross-section.

In this embodiment, the set 31 of microwave radiators are arranged in a square configuration. As in the system of FIG. 1, each of the radiators 31a, 31b, 31c, is supplied with microwave power in progressively decreasing level, so as to heat the corresponding regions of the rod 30 to radially uniform temperatures that decrease step-wise with increasing distance from the melt. However, in the embodiment of FIG. 4, different power and/or frequency sweep ranges are used in conjunction with the microwave power sources for each of the individual microwave radiator channels 32. For example, the corner channels 32a, 32a' are driven from a first microwave power source 33a having a corresponding frequency sweep control 34a. This same source 33a may be used to provide power to the microwave cavities at the other three corners of the radiator 31c. A separate microwave power source 33b and associated frequency sweep control 34b are used to drive the central microwave channels 32b, 32b' facing the sides of the rod 30 at the centers thereof. This source 33b also may be used to drive the corresponding central microwave channels facing the other two sides of the rod 30. Other microwave power sources (not shown) are used to drive the remaining channels of the radiator 31c.

Because of the square geometry of the rod 30, the corner radiator channels 32a, 32a' must effectuate heating of the rod 30 to a greater depth than is effectuated by the central radiators 32b, 32b'. This is illustrated by the field patterns 35 and 36 respectively of the corner and central radiator channels 32a, 32a' and 32b, 32b' (FIG. 4).

Such field patterns may be accomplished by using the control 34a to sweep the microwave power source 33a to a lower frequency, and hence greater depth of penetration, than the minimum frequency to which the power source 33b is swept. If necessary, power levels from the sources 33a and 33b may be appropriately controlled as a function of frequency so as to produce a heating pattern which results in substantially uniform temperature throughout the region of the rod 30 that is heated by the radiator 31c. A similar arrangement is used in conjunction with each of the radiators 31a, 31b, etc. so that at each corresponding level of the rod 30 the lateral temperature gradient is substantially zero. In other words, the temperature of the rod 30 decreases step-wise from the melt to the puller, but at each region the temperature is substantially uniform over the entire cross-section of the rod.

In the foregoing manner, controlled microwave heating is used to establish the temperature of the single crystal material being pulled from the melt. Unlike prior art techniques in which the temperature at each region of the rod depends solely on the thermal radiation pattern, with a concomitant non-zero lateral temperature gradient at each region, the present invention uses controlled microwave energy to inject heat into the rod at each region. The heating is controlled so as to complement the normal lateral temperature gradient, and thereby to provide a uniform lateral temperature, independent of radius, in each region. As a result, uniform cooling of the entire rod is achieved regardless of the rod cross-sectional shape. Rods of arbitrary cross-sectional geometry can be obtained. The pulling rate can be increased substantially above that of the prior art by utilizing stratified microwave coupling components that provide a step-wise decrease in temperature, within increasing distance from the melt, commensurate with the particular pulling rate.

What is claimed is:

1. A method for the control of thermal gradients in crystal pulling, comprising:
   heating by microwave energy the crystal being pulled at a series of positions increasing in distance from the melt from which the crystal is formed, and
   controlling said microwave heating at each position so as to produce a substantially uniform temperature laterally across the crystal at said position, the uniform temperatures decreasing step-wise at successive positions with increasing distance from the melt.

2. A method according to claim 1 wherein said controlling includes:
   sweeping the frequency of said microwave energy through a range of frequencies to heat different depths of said crystal while maintaining said power substantially constant.

3. A method according to claim 1 wherein said controlling comprises:
   sweeping the frequency through a range of frequencies and controlling the power of said microwave energy so as to heat said crystal at different depths to an extent that complements the temperature gradient resulting from thermal radiation from said crystal.

4. A method according to claim 1 wherein said crystal has a non-circular cross-sectional geometry, wherein said heating is carried out by using at each position plural microwave radiation sources locationally arranged to conform in shape to said crystal cross-sectional geometry, and wherein said controlling includes separately controlling the frequency and power of microwave radiation sources at different locations around said crystal to produce said substantially uniform temperature.

5. A crystal growth technique, comprising:
   pulling a crystal from a melt, said crystal assuming an elongated configuration,
   providing around said crystal at respective different distances from said melt a plurality of microwave radiators, and
   energizing said radiators with microwave power sources, the frequency of individual power sources being swept through a range of frequencies, said sources having respective power levels that are progressively decreasingly stepped with increasing distance from said melt, microwave power from said energized radiators heating the interior of said crystal at each distance to obtain therein a certain lateral temperature distribution.

6. The technique of claim 5 wherein said crystal has a non-circular cross-sectional shape, wherein said providing comprises supplying, at each of said distances, a set of microwave radiators, said set conforming in shape to the cross-sectional geometry of said crystal, and wherein said energizing comprises separately frequency sweeping different ones of each set over correspondingly different frequency ranges to achieve heating of said crystal to said certain lateral temperature distribution.

7. The technique of claim 5 or 6 wherein said energizing is controlled to produce within said crystal, at each of said respective different distances, a substantially uniform temperature laterally across the entire crystal.

8. The technique of claim 5 wherein said crystal is single crystal semiconductor device grade silicon.

9. The technique of claim 6 wherein said crystal is silicon, wherein said cross-sectional shape is rectangular or trapezoidal, and comprising the further steps of:
   transversely slicing said crystal into wafers of corresponding rectangular or trapezoidal shape,
   converting each slice to a solar cell, and
   assembling said solar cells into a planar array with said cells in closely spaced relationship to each other, said array thereby having a greater density of solar cell area per unit array area than with conventional circular solar cells.

10. An apparatus for controlling thermal gradients in the growth of a crystal being pulled by a puller from a melt, comprising:
- a plurality of microwave radiators arranged linearly along the direction of pulling by said puller so that said crystal will sequentially pass each of said radiators and be heated by microwave energy radiated thereform, and
- a like plurality of controlled microwave power sources each connected to drive a respective radiator, said sources being controlled so that power levels of microwave energy from said radiators progressively decrease with increasing distance of said radiators from said melt, the frequency of individual power sources being swept through a range of frequencies to achieve by said heating a certain lateral temperature distribution in said crystal.

11. A stratified microwave coupling system for use in the growth of a crystal from a melt, comprising:
- a plurality of microwave cavities mounted in sequence along the path of the crystal being grown,
- means for energizing said microwave cavities so that the resultant microwave energy radiated thereby will heat to different degrees respective regions of the crystal being grown, said energizing means comprising:
- a plurality of microwave power sources each associated with a respective one of said cavities, the power levels of said sources being stepped so that said resultant microwave energy will heat to correspondingly lower temperatures regions of said crystal that are progressively further from said melt.

12. A stratified microwave coupling system according to claim 11 wherein said energizing means further comprises:
- a frequency sweep control associated with each of said power sources, and operative to sweep the frequency of the microwave energy radiated from the associated cavity through a range of frequencies, thereby heating different depths of said respective crystal region and producing at said region a certain lateral temperature distribution.

13. A stratified microwave coupling system according to claim 12 wherein said frequency sweep control sweeps said frequency through a range that results in producing a substantially uniform temperature laterally across said entire region.

14. A stratified microwave coupling system according to claim 12 wherein each cavity conforms in shape to the cross-sectional shape of said crystal.

15. A stratified microwave coupling system according to claim 14 wherein said crystal cross-sectional shape is rectangular or trapezoidal, and wherein the microwave energy radiated from different portions of each cavity is swept through correspondingly different frequency ranges to achieve said certain temperature distribution.

* * * * *